US012785376B2

(12) United States Patent
Telefus et al.

(10) Patent No.: US 12,785,376 B2
(45) Date of Patent: Nov. 3, 2026

(54) FET-BASED AC-TO-DC CONVERTER WITH NEGATIVE CYCLE GATE PRE-CHARGE

(71) Applicant: Amber Semiconductor, Inc., Dublin, CA (US)

(72) Inventors: Mark Telefus, Orinda, CA (US); Suhail Zain, San Ramon, CA (US); Steve Dreyer, Los Altos, CA (US)

(73) Assignee: Amber Semiconductor, Inc., Dublin, CA (US)

( * ) Notice: Subject to any disclaimer, the term of this patent is extended or adjusted under 35 U.S.C. 154(b) by 46 days.

(21) Appl. No.: 18/871,934

(22) PCT Filed: Jun. 28, 2023

(86) PCT No.: PCT/US2023/026448
§ 371 (c)(1),
(2) Date: Dec. 5, 2024

(87) PCT Pub. No.: WO2024/006354
PCT Pub. Date: Jan. 4, 2024

(65) Prior Publication Data

US 2026/0074603 A1 Mar. 12, 2026

Related U.S. Application Data

(60) Provisional application No. 63/356,317, filed on Jun. 28, 2022.

(51) Int. Cl.
*H02H 1/06* (2006.01)
*H02M 7/217* (2006.01)
(Continued)

(52) U.S. Cl.
CPC ............ *H02H 1/06* (2013.01); *H02M 7/2176* (2013.01); *H02M 1/08* (2013.01); *H03K 17/04206* (2013.01)

(58) Field of Classification Search
CPC ....... H02H 1/06–1/066; H02M 1/0006; H02M 1/08; H02M 7/06; H02M 7/217; H02M 7/2176; H03K 17/04206
See application file for complete search history.

(56) References Cited

U.S. PATENT DOCUMENTS

| | | | |
|---|---|---|---|
| 3,638,102 | A | 1/1972 | Pelka |
| 3,777,253 | A | 12/1973 | Callan |

(Continued)

FOREIGN PATENT DOCUMENTS

| | | | |
|---|---|---|---|
| CA | 2799865 | A1 | 6/2013 |
| CN | 1246208 | A | 3/2000 |

(Continued)

OTHER PUBLICATIONS

K. Yang et al. "Series Arc Fault Detection Algorithm Based on Autoregressive Bispecturm Analysis," Algorithms, vol. 8, Oct. 16, 2015, pp. 929-950.

(Continued)

*Primary Examiner* — Fred E Finch, III
(74) *Attorney, Agent, or Firm* — Ryan, Mason & Lewis, LLP

(57) ABSTRACT

A power converter circuit comprises a solid-state switch connected between first and second nodes, a capacitor coupled between the second node and a ground reference node, and a control system which monitors a voltage level across the capacitor and (i) turns on the solid-state switch during a positive half-cycle of an AC power waveform coupled to the first node to cause the capacitor to be charged, when the voltage level across the capacitor is less than a maximum DC voltage level, and (ii) turn off the solid-state switch during the positive half-cycle of the AC power waveform, in response to determining that the voltage level across the capacitor has reached the maximum DC voltage level. The control system is configured to generate a regu- (Continued)

lated threshold voltage for the solid-state switch during a negative half-cycle of the AC power waveform while maintaining the solid-state switch turned off during the negative half-cycle.

20 Claims, 4 Drawing Sheets

(51) Int. Cl.
*H03K 17/042* (2006.01)
*H02M 1/08* (2006.01)

(56) References Cited

U.S. PATENT DOCUMENTS

| | | | |
|---|---|---|---|
| 4,074,345 | A | 2/1978 | Ackermann |
| 4,127,895 | A | 11/1978 | Krueger |
| 4,245,148 | A | 1/1981 | Gisske et al. |
| 4,245,184 | A | 1/1981 | Billings et al. |
| 4,245,185 | A | 1/1981 | Mitchell et al. |
| 4,257,081 | A | 3/1981 | Sauer et al. |
| 4,466,071 | A | 8/1984 | Russell, Jr. |
| 4,487,458 | A | 12/1984 | Janutka |
| 4,581,540 | A | 4/1986 | Guajardo |
| 4,631,625 | A | 12/1986 | Alexander et al. |
| 4,636,907 | A | 1/1987 | Howell |
| 4,641,233 | A | 2/1987 | Roy |
| 4,649,302 | A | 3/1987 | Damiano et al. |
| 4,653,084 | A | 3/1987 | Ahuja |
| 4,682,061 | A | 7/1987 | Donovan |
| 4,685,046 | A | 8/1987 | Sanders |
| 4,709,296 | A | 11/1987 | Hung et al. |
| 4,760,293 | A | 7/1988 | Hebenstreit |
| 4,766,281 | A | 8/1988 | Buhler |
| 4,806,844 | A | 2/1989 | Claydon et al. |
| 4,812,995 | A | 3/1989 | Girgis et al. |
| 4,823,225 | A | 4/1989 | Foster et al. |
| 4,888,504 | A | 12/1989 | Kinzer |
| 4,945,345 | A | 7/1990 | Proctor et al. |
| 5,041,960 | A | 8/1991 | Tseruel |
| 5,118,993 | A | 6/1992 | Yang |
| 5,121,282 | A | 6/1992 | White |
| 5,276,737 | A | 1/1994 | Micali |
| 5,307,257 | A | 4/1994 | Fukushima |
| 5,371,646 | A | 12/1994 | Biegelmeier |
| 5,410,745 | A | 4/1995 | Friesen et al. |
| 5,559,656 | A | 9/1996 | Chokhawala |
| 5,646,514 | A | 7/1997 | Tsunetsugu |
| 5,654,880 | A | 8/1997 | Brkovic et al. |
| 5,731,732 | A | 3/1998 | Williams |
| 5,793,596 | A | 8/1998 | Jordan et al. |
| 5,796,274 | A | 8/1998 | Willis et al. |
| 5,801,933 | A | 9/1998 | Ravid |
| 5,844,759 | A | 12/1998 | Hirsh et al. |
| 5,859,756 | A | 1/1999 | Pressman et al. |
| 5,870,009 | A | 2/1999 | Serpinet et al. |
| 5,933,305 | A | 8/1999 | Schmalz et al. |
| 6,081,123 | A | 6/2000 | Kasbarian et al. |
| 6,111,494 | A | 8/2000 | Fischer et al. |
| 6,111,733 | A | 8/2000 | Neiger et al. |
| 6,115,267 | A | 9/2000 | Herbert |
| 6,141,197 | A | 10/2000 | Kim et al. |
| 6,160,689 | A | 12/2000 | Stolzenberg |
| 6,167,329 | A | 12/2000 | Engel et al. |
| 6,169,391 | B1 | 1/2001 | Lei |
| 6,188,203 | B1 | 2/2001 | Rice et al. |
| 6,232,742 | B1 | 5/2001 | Wacknov et al. |
| 6,282,109 | B1 | 8/2001 | Fraidlin et al. |
| 6,300,748 | B1 | 10/2001 | Miller |
| 6,369,554 | B1 | 4/2002 | Aram |
| 6,437,955 | B1 | 8/2002 | Duffy et al. |
| 6,483,290 | B1 | 11/2002 | Hemminger et al. |
| 6,515,434 | B1 | 2/2003 | Biebl |
| 6,538,906 | B1 | 3/2003 | Ke et al. |
| 6,788,512 | B2 | 9/2004 | Vicente et al. |
| 6,807,035 | B1 | 10/2004 | Baldwin et al. |
| 6,813,720 | B2 | 11/2004 | Leblanc |
| 6,839,208 | B2 | 1/2005 | Macbeth et al. |
| 6,843,680 | B2 | 1/2005 | Gorman |
| 6,906,476 | B1 | 6/2005 | Beatenbough et al. |
| 6,984,988 | B2 | 1/2006 | Yamamoto |
| 7,045,723 | B1 | 5/2006 | Projkovski |
| 7,053,626 | B2 | 5/2006 | Monter et al. |
| 7,110,225 | B1 | 9/2006 | Hick |
| 7,136,265 | B2 | 11/2006 | Wong et al. |
| 7,164,238 | B2 | 1/2007 | Kazanov et al. |
| 7,292,419 | B1 | 11/2007 | Nemir |
| 7,297,603 | B2 | 11/2007 | Robb et al. |
| 7,304,828 | B1 | 12/2007 | Shvartsman |
| D558,683 | S | 1/2008 | Pape et al. |
| 7,319,574 | B2 | 1/2008 | Engel |
| D568,253 | S | 5/2008 | Gorman |
| 7,367,121 | B1 | 5/2008 | Gorman |
| 7,586,285 | B2 | 9/2009 | Gunji |
| 7,595,680 | B2 | 9/2009 | Morita et al. |
| 7,596,004 | B2 | 9/2009 | Grbovic |
| 7,633,727 | B2 | 12/2009 | Zhou et al. |
| 7,643,256 | B2 | 1/2010 | Wright et al. |
| 7,693,670 | B2 | 4/2010 | Durling et al. |
| 7,715,216 | B2 | 5/2010 | Liu et al. |
| 7,729,147 | B1 | 6/2010 | Wong et al. |
| 7,731,403 | B2 | 6/2010 | Lynam et al. |
| 7,746,677 | B2 | 6/2010 | Unkrich |
| 7,821,023 | B2 | 10/2010 | Yuan et al. |
| D638,355 | S | 5/2011 | Chen |
| 7,936,279 | B2 | 5/2011 | Tang et al. |
| 7,948,719 | B2 | 5/2011 | Xu |
| 8,124,888 | B2 | 2/2012 | Etemad-Moghadam et al. |
| 8,174,804 | B2 | 5/2012 | Fasano |
| 8,184,419 | B2 | 5/2012 | Peng |
| 8,256,675 | B2 | 9/2012 | Baglin et al. |
| 8,295,950 | B1 | 10/2012 | Wordsworth et al. |
| 8,374,729 | B2 | 2/2013 | Chapel et al. |
| 8,463,453 | B2 | 6/2013 | Parsons, Jr. |
| 8,482,885 | B2 | 7/2013 | Billingsley et al. |
| 8,560,134 | B1 | 10/2013 | Lee |
| 8,649,883 | B2 | 2/2014 | Lu et al. |
| 8,664,886 | B2 | 3/2014 | Ostrovsky |
| 8,717,720 | B2 | 5/2014 | DeBoer |
| 8,718,830 | B2 | 5/2014 | Smith |
| 8,737,030 | B2 | 5/2014 | Valdes |
| 8,781,637 | B2 | 7/2014 | Eaves |
| 8,817,441 | B2 | 8/2014 | Callanan |
| 8,890,371 | B2 | 11/2014 | Gotou |
| D720,295 | S | 12/2014 | Dodal et al. |
| 8,947,838 | B2 | 2/2015 | Yamai et al. |
| 9,054,587 | B2 | 6/2015 | Neyman |
| 9,055,641 | B2 | 6/2015 | Shteynberg et al. |
| 9,237,617 | B1 | 1/2016 | Xiong |
| 9,287,792 | B2 | 3/2016 | Telefus et al. |
| 9,325,516 | B2 | 4/2016 | Pera et al. |
| 9,366,702 | B2 | 6/2016 | Steele et al. |
| 9,439,318 | B2 | 9/2016 | Chen |
| 9,443,845 | B1 | 9/2016 | Stafanov et al. |
| 9,502,832 | B1 | 11/2016 | Ullahkhan et al. |
| 9,509,083 | B2 | 11/2016 | Yang |
| 9,515,560 | B1 | 12/2016 | Telefus et al. |
| 9,577,420 | B2 | 2/2017 | Ostrovsky et al. |
| 9,608,430 | B2 | 3/2017 | Duan et al. |
| 9,621,053 | B1 | 4/2017 | Telefus |
| 9,729,066 | B1 | 8/2017 | Lu et al. |
| 9,755,630 | B2 | 9/2017 | Urciuoli |
| 9,759,758 | B2 | 9/2017 | Ostrovsky et al. |
| 9,774,182 | B2 | 9/2017 | Phillips |
| 9,836,243 | B1 | 12/2017 | Chanler et al. |
| 9,883,554 | B2 | 1/2018 | Lynch |
| D814,424 | S | 4/2018 | DeCosta |
| 9,965,007 | B2 | 5/2018 | Amelio et al. |
| 9,978,553 | B2 | 5/2018 | Tomimbang et al. |
| 9,991,633 | B2 | 6/2018 | Robinet |
| 10,072,942 | B2 | 9/2018 | Wootton et al. |
| 10,076,006 | B2 | 9/2018 | Kahlman et al. |
| 10,101,716 | B2 | 10/2018 | Kim |
| 10,135,235 | B2 | 11/2018 | Cui et al. |

(56) References Cited

U.S. PATENT DOCUMENTS 10,187,944 B2 1/2019 MacAdam et al.
10,243,350 B2 3/2019 Pan et al.
10,469,077 B2 11/2019 Telefus et al.
10,548,188 B2 1/2020 Cheng et al.
D879,056 S 3/2020 Telefus
D881,144 S 4/2020 Telefus
10,615,713 B2 4/2020 Telefus et al.
10,756,662 B2 8/2020 Steiner et al.
10,812,072 B2 10/2020 Telefus et al.
10,812,282 B2 10/2020 Telefus et al.
10,819,336 B2 10/2020 Telefus et al.
10,834,792 B2 11/2020 Telefus et al.
10,931,473 B2 2/2021 Telefus et al.
10,985,548 B2 4/2021 Telefus
10,992,236 B2 4/2021 Telefus et al.
11,050,236 B2 6/2021 Telefus et al.
11,056,981 B2 7/2021 Telefus
11,064,586 B2 7/2021 Telefus et al.
11,114,947 B2 9/2021 Telefus et al.
11,170,964 B2 11/2021 Telefus et al.
11,201,460 B2 12/2021 Oishi et al.
11,245,339 B2 2/2022 Telefus et al.
11,336,199 B2 5/2022 Telefus et al.
11,342,151 B2 5/2022 Telefus et al.
11,342,735 B2 5/2022 Telefus et al.
11,348,752 B2 5/2022 Telefus et al.
11,349,296 B2 5/2022 Telefus
11,349,297 B2 5/2022 Telefus et al.
11,363,690 B2 6/2022 Telefus et al.
11,373,831 B2 6/2022 Telefus et al.
11,422,520 B2 8/2022 Telefus et al.
11,551,899 B2 1/2023 Telefus et al.
11,581,725 B2 2/2023 Telefus
11,670,946 B2 6/2023 Telefus et al.
11,671,029 B2 6/2023 Telefus
11,682,891 B2 6/2023 Telefus et al.
11,721,508 B2 8/2023 Telefus et al.
11,764,565 B2 9/2023 Telefus
11,791,616 B2 10/2023 Telefus
11,870,364 B2 1/2024 Telefus
12,015,261 B2 6/2024 Telefus et al.
12,095,275 B2 9/2024 Telefus et al.
2002/0109487 A1 8/2002 Telefus et al.
2002/0131287 A1 9/2002 Majumdar et al.
2003/0052544 A1 3/2003 Yamamoto et al.
2003/0063420 A1 4/2003 Pahl et al.
2003/0125885 A1 7/2003 Dougherty et al.
2003/0151865 A1 8/2003 Maio
2003/0161165 A1* 8/2003 Salvatore ................. H02H 1/06 363/45
2004/0032756 A1 2/2004 Van Den Bossche
2004/0201279 A1 10/2004 Templeton
2004/0251884 A1 12/2004 Steffie et al.
2005/0128657 A1 6/2005 Covault
2005/0162139 A1 7/2005 Hirst
2005/0185353 A1 8/2005 Rasmussen et al.
2005/0286184 A1 12/2005 Campolo
2006/0227469 A1 10/2006 Parker et al.
2006/0285366 A1 12/2006 Radecker et al.
2007/0008747 A1 1/2007 Soldano et al.
2007/0018506 A1 1/2007 Paik et al.
2007/0159745 A1 7/2007 Berberich et al.
2007/0188025 A1 8/2007 Keagy et al.
2007/0217237 A1 9/2007 Palestrina
2007/0236152 A1 10/2007 Davis et al.
2008/0006607 A1 1/2008 Boeder et al.
2008/0072080 A1 3/2008 Chapuis et al.
2008/0136581 A1 6/2008 Heilman et al.
2008/0151444 A1 6/2008 Upton
2008/0174922 A1 7/2008 Kimbrough
2008/0180866 A1 7/2008 Wong
2008/0197699 A1 8/2008 Yu et al.
2008/0198637 A1 8/2008 Meysenc et al.
2008/0204950 A1 8/2008 Zhou et al.
2008/0234879 A1 9/2008 Fuller et al.
2008/0238488 A1 10/2008 Comisky et al.
2008/0246451 A1 10/2008 Dobbins et al.
2008/0253153 A1 10/2008 Wu et al.
2009/0034139 A1 2/2009 Martin
2009/0067201 A1 3/2009 Cai
2009/0168273 A1 7/2009 Yu et al.
2009/0213629 A1 8/2009 Liu et al.
2009/0284385 A1 11/2009 Tang et al.
2009/0296432 A1 12/2009 Chapuis
2010/0013307 A1 1/2010 Heineman et al.
2010/0090533 A1 4/2010 Shimada et al.
2010/0091418 A1 4/2010 Xu
2010/0156369 A1 6/2010 Kularatna et al.
2010/0176661 A1 7/2010 Wilson
2010/0188054 A1 7/2010 Asakura et al.
2010/0191487 A1 7/2010 Rada et al.
2010/0231135 A1 9/2010 Hum et al.
2010/0231373 A1 9/2010 Romp
2010/0244730 A1 9/2010 Nerone
2010/0261373 A1 10/2010 Roneker
2010/0270982 A1 10/2010 Hausman, Jr. et al.
2010/0284207 A1 11/2010 Watanabe et al.
2010/0296207 A1 11/2010 Schumacher et al.
2010/0320840 A1 12/2010 Fridberg
2011/0062936 A1 3/2011 Bartelous
2011/0121752 A1 5/2011 Newman, Jr. et al.
2011/0127922 A1 6/2011 Sauerlaender
2011/0133658 A1 6/2011 Sauerlaender et al.
2011/0134671 A1 6/2011 Balocco
2011/0156610 A1 6/2011 Ostrovsky et al.
2011/0227615 A1 9/2011 Faison
2011/0234000 A1 9/2011 Yan et al.
2011/0273103 A1 11/2011 Hong
2011/0292703 A1 12/2011 Cuk
2011/0301894 A1 12/2011 Sanderford, Jr.
2011/0305054 A1 12/2011 Yamagiwa et al.
2011/0307447 A1 12/2011 Sabaa et al.
2012/0026632 A1 2/2012 Acharya et al.
2012/0075897 A1 3/2012 Fujita
2012/0080942 A1 4/2012 Carralero et al.
2012/0086416 A1 4/2012 Kudo et al.
2012/0089266 A1 4/2012 Tomimbang et al.
2012/0089366 A1 4/2012 Huyse
2012/0092797 A1 4/2012 Reeder et al.
2012/0095605 A1 4/2012 Tran
2012/0120700 A1 5/2012 Elberbaum
2012/0133289 A1 5/2012 Hum et al.
2012/0275076 A1 11/2012 Shono
2012/0323510 A1 12/2012 Bell et al.
2013/0021708 A1 1/2013 Demetriades et al.
2013/0026925 A1 1/2013 Ven et al.
2013/0033246 A1 2/2013 Krenz et al.
2013/0051102 A1 2/2013 Huang et al.
2013/0057247 A1 3/2013 Russell et al.
2013/0063851 A1 3/2013 Stevens et al.
2013/0066478 A1 3/2013 Smith
2013/0088160 A1 4/2013 Chai et al.
2013/0119958 A1 5/2013 Gasperi
2013/0128396 A1 5/2013 Danesh et al.
2013/0170261 A1 7/2013 Lee et al.
2013/0176758 A1 7/2013 Tseng et al.
2013/0187631 A1 7/2013 Russell et al.
2013/0253898 A1 9/2013 Meagher et al.
2013/0261821 A1 10/2013 Lu et al.
2013/0265041 A1 10/2013 Friedrich et al.
2013/0329331 A1 12/2013 Erger et al.
2014/0043732 A1 2/2014 McKay et al.
2014/0049117 A1 2/2014 Rahman
2014/0049990 A1 2/2014 Limpaecher
2014/0067137 A1 3/2014 Amelio et al.
2014/0085940 A1 3/2014 Lee et al.
2014/0097809 A1 4/2014 Follic et al.
2014/0126258 A1* 5/2014 Neyman ............. H02M 7/2176 363/84
2014/0159593 A1 6/2014 Chu et al.
2014/0164294 A1 6/2014 Osann, Jr.
2014/0203718 A1 7/2014 Yoon et al.
2014/0268935 A1 9/2014 Chiang
2014/0268956 A1 9/2014 Teren et al.

(56) References Cited

U.S. PATENT DOCUMENTS

2014/0276753 A1 9/2014 Wham et al.
2014/0365490 A1 12/2014 Yang et al.
2015/0042274 A1 2/2015 Kim et al.
2015/0055261 A1 2/2015 Lubicki et al.
2015/0097430 A1 4/2015 Scruggs
2015/0116886 A1 4/2015 Zehnder et al.
2015/0155789 A1 6/2015 Freeman et al.
2015/0180469 A1 6/2015 Kim
2015/0185262 A1 7/2015 Song et al.
2015/0216006 A1 7/2015 Lee et al.
2015/0236587 A1 8/2015 Kim et al.
2015/0256355 A1 9/2015 Pera et al.
2015/0256665 A1 9/2015 Pera et al.
2015/0288293 A1* 10/2015 Siessegger .............. H02M 7/06 315/246
2015/0317326 A1 11/2015 Bandarupalli et al.
2016/0006362 A1* 1/2016 Morrish .............. H02M 7/2176 363/84
2016/0057841 A1 2/2016 Lenig
2016/0069933 A1 3/2016 Cook et al.
2016/0077746 A1 3/2016 Muth et al.
2016/0079757 A1 3/2016 Matan et al.
2016/0081143 A1 3/2016 Wang
2016/0126031 A1 5/2016 Wootton et al.
2016/0178691 A1 6/2016 Simonin
2016/0181941 A1 6/2016 Gratton et al.
2016/0195864 A1 7/2016 Kim
2016/0247799 A1 8/2016 Stafanov et al.
2016/0294179 A1 10/2016 Kennedy et al.
2016/0301319 A1 10/2016 Vermulst
2016/0322807 A1 11/2016 Milkie
2016/0322809 A1 11/2016 Wang et al.
2016/0360586 A1 12/2016 Yang et al.
2016/0381754 A1 12/2016 Chou et al.
2017/0004948 A1 1/2017 Leyh
2017/0019969 A1 1/2017 O'Neil et al.
2017/0063225 A1 3/2017 Guo et al.
2017/0067961 A1 3/2017 O'Flynn
2017/0086281 A1 3/2017 Avrahamy
2017/0104325 A1 4/2017 Eriksen et al.
2017/0105265 A1 4/2017 Sadwick
2017/0110878 A1 4/2017 Jacobson
2017/0168516 A1 6/2017 King
2017/0170730 A1 6/2017 Sugiura
2017/0179946 A1 6/2017 Turvey
2017/0214967 A1 7/2017 Xia et al.
2017/0244241 A1 8/2017 Wilson et al.
2017/0256934 A1 9/2017 Kennedy et al.
2017/0256956 A1 9/2017 Irish et al.
2017/0265287 A1 9/2017 Avrahamy
2017/0277709 A1 9/2017 Strauss et al.
2017/0314743 A1 11/2017 Del Castillo et al.
2017/0322049 A1 11/2017 Wootton et al.
2017/0322258 A1 11/2017 Miller et al.
2017/0338809 A1 11/2017 Stefanov et al.
2017/0347415 A1 11/2017 Cho et al.
2018/0026534 A1 1/2018 Turcan
2018/0054862 A1 2/2018 Takagimoto et al.
2018/0059175 A1 3/2018 Hase
2018/0130618 A1 5/2018 Ramirez
2018/0188706 A1 7/2018 Wootton et al.
2018/0201302 A1 7/2018 Sonoda et al.
2018/0285198 A1 10/2018 Dantkale et al.
2018/0307609 A1 10/2018 Qiang et al.
2018/0316179 A1 11/2018 Ofek
2018/0323723 A1 11/2018 Mochizuki
2018/0351342 A1 12/2018 Anderson et al.
2019/0003855 A1 1/2019 Wootton et al.
2019/0052174 A1 2/2019 Gong
2019/0103742 A1 4/2019 Kennedy et al.
2019/0109453 A1* 4/2019 Neyman .................. H02H 1/06
2019/0122834 A1 4/2019 Wootton et al.
2019/0140640 A1 5/2019 Telefus et al.
2019/0148931 A1 5/2019 Li
2019/0165691 A1 5/2019 Telefus et al.
2019/0181679 A1 6/2019 Northway et al.
2019/0207375 A1 7/2019 Telefus et al.
2019/0222058 A1 7/2019 Sharifipour
2019/0238060 A1 8/2019 Telefus et al.
2019/0245457 A1 8/2019 Telefus et al.
2019/0280887 A1 9/2019 Telefus et al.
2019/0312460 A1 10/2019 Van Boheemen et al.
2019/0372331 A1 12/2019 Liu et al.
2020/0007126 A1 1/2020 Telefus et al.
2020/0014301 A1 1/2020 Telefus
2020/0014379 A1 1/2020 Telefus
2020/0044883 A1 2/2020 Telefus et al.
2020/0052607 A1 2/2020 Telefus et al.
2020/0106259 A1 4/2020 Telefus
2020/0106260 A1 4/2020 Telefus
2020/0196412 A1 6/2020 Telefus et al.
2020/0287537 A1 9/2020 Telefus et al.
2020/0328694 A1 10/2020 Telefus et al.
2020/0365345 A1 11/2020 Telefus et al.
2020/0365346 A1 11/2020 Telefus et al.
2020/0365356 A1 11/2020 Telefus et al.
2020/0366078 A1 11/2020 Telefus et al.
2020/0366079 A1 11/2020 Telefus et al.
2021/0014947 A1 1/2021 Telefus et al.
2021/0119528 A1 4/2021 Telefus
2021/0173364 A1 6/2021 Telefus et al.
2021/0226441 A1 7/2021 Telefus et al.
2021/0234356 A1 7/2021 Telefus et al.
2021/0258007 A1 8/2021 Wu
2021/0335563 A1 10/2021 Guziak
2021/0336555 A1 10/2021 Telefus
2021/0345462 A1 11/2021 Telefus et al.
2022/0052533 A1 2/2022 Telefus et al.
2022/0189721 A1 6/2022 Telefus et al.
2022/0255310 A1 8/2022 Telefus
2022/0311350 A1 9/2022 Telefus
2022/0399174 A1 12/2022 Telefus et al.
2022/0416681 A1 12/2022 Telefus
2023/0067227 A1 3/2023 Telefus
2023/0121575 A1 4/2023 Baker
2023/0127078 A1 4/2023 Telefus et al.
2023/0137013 A1 5/2023 Telefus
2023/0162937 A1 5/2023 Telefus et al.
2023/0253799 A1 8/2023 Telefus et al.
2023/0261560 A1 8/2023 Baker et al.
2024/0178653 A1 5/2024 Telefus et al.
2024/0339825 A1 10/2024 Telefus et al.
2024/0396464 A1 11/2024 Telefus et al.

FOREIGN PATENT DOCUMENTS

CN 102165555 A 8/2011
CN 108075449 A 5/2018
CN 109075551 B 1/2021
DE 19712261 A1 10/1998
EP 0016646 A1 10/1980
EP 0398026 A2 11/1990
EP 2560063 A1 2/2013
GB 1302357 A 1/1973
GB 2396982 A 7/2004
GB 2458699 A 9/2009
GB 2556081 A 5/2018
JP 06-053779 A 2/1994
JP 2001196908 A 7/2001
JP 2006014479 A 1/2006
JP 2007110844 A 4/2007
JP 2010103099 A 5/2010
JP 2010530730 A 9/2010
JP 2012244716 A 12/2012
JP 2013230034 A 11/2013
JP 2014030355 A 2/2014
JP 2015128356 A 7/2015
JP 2016092881 A 5/2016
JP 2016213179 A 12/2016
JP 2017208938 A 11/2017
JP 2019515639 A 6/2019
JP 6997105 B2 1/2022
KR 101436703 B1 9/2014
WO 9829927 A2 7/1998

(56) References Cited

FOREIGN PATENT DOCUMENTS

| | | | |
|---|---|---|---|
| WO | 9829928 | A2 | 7/1998 |
| WO | 9829930 | A2 | 7/1998 |
| WO | 9829931 | A2 | 7/1998 |
| WO | 2010110951 | A1 | 9/2010 |
| WO | 2010151684 | A1 | 12/2010 |
| WO | 2014152794 | A1 | 9/2014 |
| WO | 2016105505 | A1 | 6/2016 |
| WO | 2016110833 | A2 | 7/2016 |
| WO | 2017196571 | A1 | 11/2017 |
| WO | 2017196572 | A1 | 11/2017 |
| WO | 2017196649 | A1 | 11/2017 |
| WO | 2018075726 | A1 | 4/2018 |
| WO | 2018080604 | A1 | 5/2018 |
| WO | 2018080614 | A1 | 5/2018 |
| WO | 2018081619 | A2 | 5/2018 |
| WO | 2018081619 | A3 | 5/2018 |
| WO | 2018159914 | A1 | 9/2018 |
| WO | 2019133110 | A1 | 7/2019 |
| WO | 2020014158 | A1 | 1/2020 |
| WO | 2020014161 | A1 | 1/2020 |
| WO | PCT/US19/54102 | | 2/2020 |
| WO | 2020072516 | A1 | 4/2020 |
| WO | PCT/US19/67004 | | 4/2020 |
| WO | 2020131977 | A1 | 6/2020 |
| WO | PCT/US20/33421 | | 9/2020 |
| WO | 2020236726 | A1 | 11/2020 |
| WO | PCT/US21/14320 | | 4/2021 |
| WO | 2021112870 | A1 | 6/2021 |
| WO | 2021150684 | A1 | 7/2021 |
| WO | 2021183172 | A1 | 9/2021 |
| WO | PCT/US21/45624 | | 11/2021 |
| WO | 2022031276 | A1 | 2/2022 |
| WO | 2022036016 | A1 | 2/2022 |
| WO | 2024006354 | A1 | 1/2024 |
| WO | 2024049836 | A2 | 3/2024 |
| WO | 2024145556 | A1 | 7/2024 |
| WO | 2024227025 | A1 | 10/2024 |

OTHER PUBLICATIONS

J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.

S. Cuk, "98% Efficient Single-Stage AC/DC Converter Topologies," Power Electronics Europe, Issue 4, 2011, 6 pages.

E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.

C. Restrepo, "Arc Fault Detection and Discrimination Methods," 2007 Proceedings of the 53rd IEEE Holm Conference on Electrical Contacts, IEEE Explore Sep. 24, 2007, 8 pages.

K. Eguchi et al., "Design of a Charge-Pump Type AC-DC Converter for RF-ID Tags," 2006 International Symposium on Communications and Information Technologies, F4D-3, IEEE, 2006, 4 pages.

A. Ayari et al., "Active Power Measurement Comparison Between Analog and Digital Methods," International Conference on Electrical Engineering and Software Applications, 2013, 6 pages.

G. D. Gregory et al., "The Arc-Fault Circuit Interrupter, an Emerging Product," IEEE, 1998, 8 pages.

D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.

B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.

L. Shengyuan et al., "Instantaneous Value Sampling AC-DC Converter and its Application in Power Quantity Detection," 2011 Third International Conference on Measuring Technology and Mechatronics Automation, Jan. 6-7, 2011, 4 pages.

H.-H. Chang et al., "Load Recognition for Different Loads with the Same Real Power and Reactive Power in a Non-intrusive Load-monitoring System," 2008 12th International Conference on Computer Supported Cooperative Work in Design, Apr. 16-18, 2008, 6 pages.

Darmayuda et al., "Ultra Fast Solid State Ground Fault Isolator," International Journal of Electronics and Communication Engineering, vol. 6, No. 9, Oct. 2012, pp. 902-905.

U.S. Appl. No. 18/744,077 filed in the name of Mark Telefus et al. on Jun. 14, 2024, and entitled "AC-to-DC Power Conversion with Ground Reference to Common Node of Solid-State AC Switch."

International Search Report and the Written Opinion of Application No. PCT/US2023/026448 dated Oct. 3, 2023.

* cited by examiner

AC POWER
200

Power Mode
$I_{Charge}$
210

Energy Storage Cycle
$V_{DC}$
220

$V_{GS}$
230

FET-BASED AC-TO-DC CONVERTER WITH NEGATIVE CYCLE GATE PRE-CHARGE

CROSS-REFERENCE TO RELATED APPLICATION

This application claims priority to U.S. Provisional Patent Application Ser. No. 63/356,317, filed on Jun. 28, 2022, the disclosure of which is incorporated herein by reference.

BACKGROUND

This disclosure relates generally to power conversion techniques and, in particular, to power conversion techniques for converting alternating current (AC) power to direct current (DC) power. Conventional approaches for converting AC power to DC power employ various analog circuitry to achieve AC-to-DC voltage conversion. For example, one type of conventional AC-to-DC converter includes a transformer-based linear converter which utilizes a simple diode bridge, capacitor, and a voltage regulator, wherein the diode bridge is constructed using four independent diodes. Another type of conventional converter implements a switch mode power supply architecture which utilizes a high-frequency small transformer and a switching regulator to provide a DC voltage output. However, such conventional approaches undesirably require many circuit components which may cause signal processing delay, inaccuracy, and/or overall increased cost to implement AC-to-DC converters.

SUMMARY

Exemplary embodiments of the disclosure include power converter circuits and methods for converting AC power to DC power, as well as intelligent electrical devices which implement such power converter circuits.

For example, an exemplary embodiment includes a power converter circuit which comprises a first solid-state switch connected between a first node and a second node, a first capacitor coupled between the second node and a ground reference node, and a control system configured to control operation of the first solid-state switch. The control system is configured to monitor a voltage level across the first capacitor and (i) turn on the first solid-state switch during a positive half-cycle of an AC power waveform coupled to the first node to cause charging current to flow from the first node to the second node and charge the first capacitor, in response to determining that the voltage level across the first capacitor is less than a maximum DC voltage level, and (ii) turn off the first solid-state switch during the positive half-cycle of the AC power waveform, in response to determining that the voltage level across the first capacitor has reached the maximum DC voltage level. The control system is configured to generate a regulated threshold voltage for the first solid-state switch during a negative half-cycle of the AC power waveform while maintaining the first solid-state switch turned off during the negative half-cycle.

Another exemplary embodiment includes an electrical device which comprises a solid-state AC switch coupled between a power input terminal and a load output terminal of the electrical device, a switch control system configured to control operation of the solid-state AC switch, and a power converter circuit configured to convert AC power, which is applied to the power input terminal of the electrical device, into DC power for operating the switch control system of the electrical device. The power converter circuit comprises a first solid-state switch connected between a first node and a second node, a first capacitor coupled between the second node and a ground reference node, and a control system configured to control operation of the first solid-state switch. The control system is configured to monitor a voltage level across the first capacitor and (i) turn on the first solid-state switch during a positive half-cycle of an AC power waveform coupled to the first node to cause charging current to flow from the first node to the second node and charge the first capacitor, in response to determining that the voltage level across the first capacitor is less than a maximum DC voltage level, and (ii) turn off the first solid-state switch during the positive half-cycle of the AC power waveform, in response to determining that the voltage level across the first capacitor has reached the maximum DC voltage level. The control system is configured to generate a regulated threshold voltage for the first solid-state switch during a negative half-cycle of the AC power waveform while maintaining the first solid-state switch turned off during the negative half-cycle.

In an exemplary embodiment, the electrical device is an intelligent solid-state circuit breaker. In another exemplary embodiment, the electrical device is an intelligent solid-state light dimmer switch.

Another exemplary embodiment includes a method which comprises: controlling a first solid-state switch, which is coupled to and between a first node and a second node, to charge a first capacitor which is coupled to and between the second node and a ground reference node, using current drawn from a positive cycle of an AC power waveform present on the first node, to generate a DC voltage on the second node, wherein controlling the first solid-state switch comprises: monitoring a voltage level across the first capacitor; turning on the first solid-state switch during the positive half-cycle of the AC power waveform to cause charging current to flow from the first node to the second node and charge the first capacitor, in response to determining that the voltage level across the first capacitor is less than a maximum DC voltage level; turning off the first solid-state switch during the positive half-cycle of the AC power waveform, in response to determining that the voltage level across the first capacitor has reached the maximum DC voltage level; and generating a regulated threshold voltage for the first solid-state switch during a negative half-cycle of the AC power waveform while maintaining the first solid-state switch turned off during the negative half-cycle.

Other embodiments will be described in the following detailed description of exemplary embodiments, which is to be read in conjunction with the accompanying figures.

DETAILED DESCRIPTION

Embodiments of the disclosure will now be described in further detail with regard to power converter circuits and methods for converting AC power to DC power, as well as intelligent electrical devices which implement such power converter circuits. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) devices, field programmable gate array (FPGA) devices, etc.), processing devices (e.g., central processing unit (CPU) devices, graphical processing unit (GPU) devices, microcontroller devices, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Figure 1:
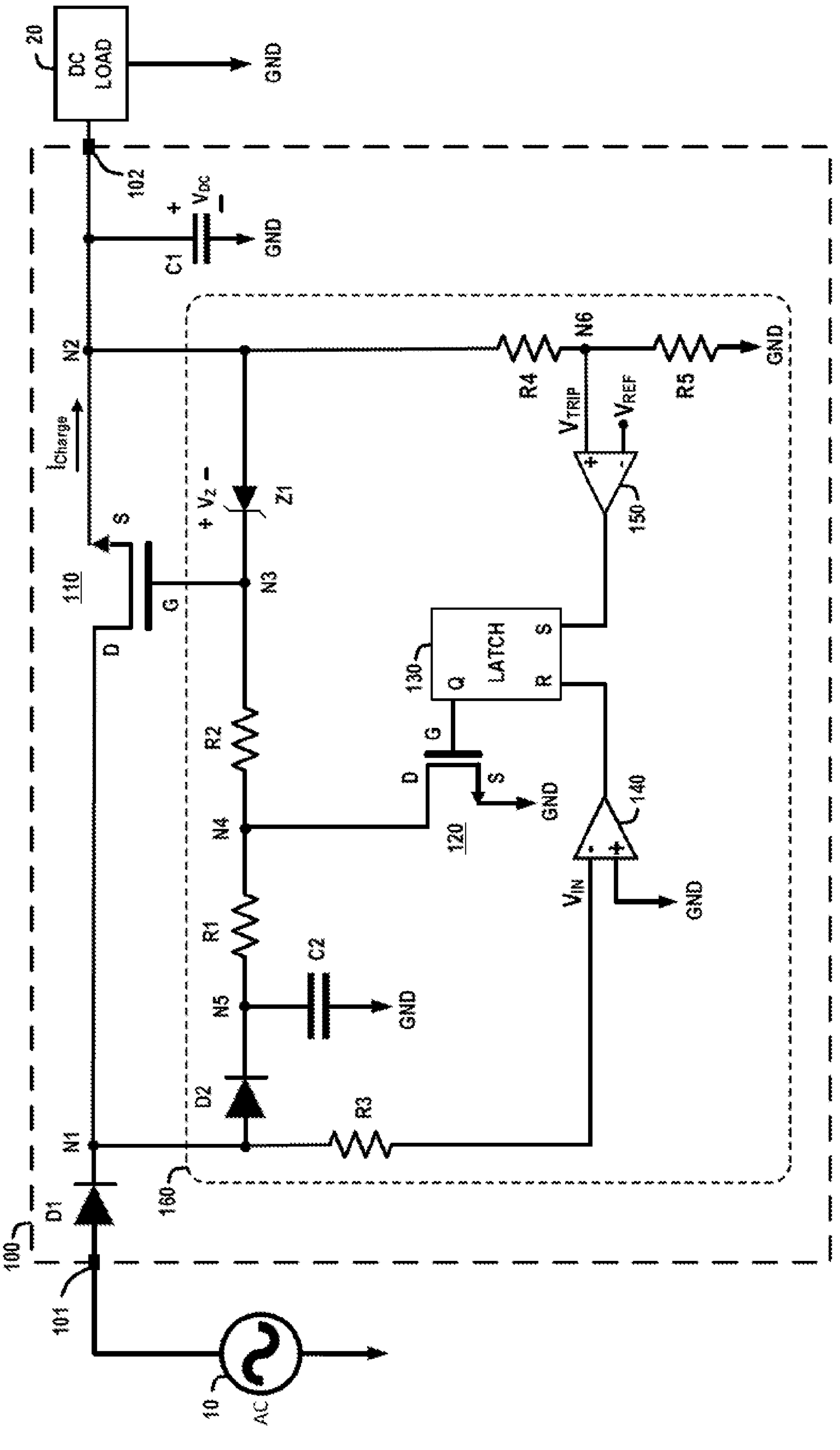
FIG. 1 schematically illustrates a power converter circuit, according to an exemplary embodiment of the disclosure.

FIG. 1 schematically illustrates a power converter circuit 100 according to an exemplary embodiment of the disclosure. In particular, FIG. 1 schematically illustrates a power converter circuit 100 that is configured to convert AC power, which is delivered from an AC power source 10, to DC power that is applied to a DC load 20. In some embodiments, the AC power source 10 comprises a utility power source (e.g., AC mains) which supplies an AC voltage waveform with a frequency of 60 Hz and a voltage of 120V RMS (a peak value of about 170V). In other embodiments, the AC power source 10 can be other sources of AC power at different voltage levels and/or frequencies. The power converter circuit 100 comprises an input terminal 101 and an output terminal 102, wherein the input terminal 101 is coupled to a terminal (e.g., line hot terminal) of the AC power source 10, and the output terminal 102 is coupled to a DC input terminal of the DC load 20. The power converter circuit 100 comprises a first diode D1, a second diode D2, a Zener diode Z1, a plurality of resistors R1, R2, R3, R4, and R5, a first capacitor C1 (alternatively, storage capacitor C1), a second capacitor C2, a first solid-state switch 110, a second solid-state switch 120, a latch circuit 130, a first operational amplifier 140 (alternatively, first comparator), and a second operational amplifier 150 (alternatively, second comparator). Collectively, the various components D1, D2, Z1, R1, R2, R3, R4, R5, C1, 120, 130, 140, and 150 comprise a control system 160 (or control circuitry). The control system 160 is configured to control the operation of the first solid-state switch 110 and thereby control a flow of current (denoted $I_{Charge}$) which charges the storage capacitor C1 to generate a DC voltage $V_{DC}$ on an output node (node N2) of the power converter circuit 100, the details of which will be explained in further detail below.

In some embodiments, the first and second solid-state switches 110 and 120 each comprise a metal-oxide-semiconductor field-effect transistor (MOSFET) device. In some embodiments, the first and second solid-state switches 110 and 120 comprise N-type MOSFET devices. In some embodiments, the first solid-state switch 110 comprises a high-voltage MOSFET device. In some embodiments, the first and second operational amplifiers 140 and 150 are configured to operate as voltage comparators. In some embodiments, the latch circuit 130 comprises a Set-Reset (SR) flip-flop circuit comprising a first input terminal (a set S input), a second input terminal (a reset R input), and an output terminal Q.

The first solid-state switch 110 comprises a first source/drain terminal (e.g., drain terminal D) coupled to a first node N1, a second source/drain terminal (e.g., source terminal S) coupled to a second node N2, and a gate terminal G coupled to a third node N3. The second solid-state switch 120 comprises a first source/drain terminal (e.g., drain terminal D) coupled to a fourth node N4, a second source/drain terminal (e.g., source terminal S) which is coupled to a ground reference node GND, and a gate terminal G that is coupled to the output terminal Q of the latch circuit 130.

The first diode D1 comprises an anode terminal that is coupled to the input terminal 101, and a cathode terminal that is coupled to the first node N1. The second diode D2 comprises an anode terminal that is coupled to the first node N1, and a cathode terminal that is coupled to a fifth node N5. The second capacitor C2 is coupled to and between the fifth node N5 and the ground reference node GND. The resistor R1 is coupled to and between nodes N4 and N5. The resistor R2 is coupled to and between nodes N3 and N4. The Zener diode Z1 comprises an anode terminal that is coupled to the second node N2, and a cathode terminal that is coupled to the third node N3.

The first comparator 140 comprises (i) a non-inverting (+) input terminal which is coupled to the ground reference node GND (ii) an inverting (−) input terminal which is coupled to the first node N1 through the resistor R3 and configured to receive an input voltage $V_{IN}$, and (iii) an output terminal coupled to the reset R input terminal of the latch circuit 130. The first comparator 140 comprises an inverting comparator topology, wherein the output of the first comparator 140 transitions to logic "1" when the input voltage $V_{IN}$ is less than the ground GND voltage, and transitions to logic "0" when the input voltage $V_{IN}$ is greater than the ground GND voltage.

The second comparator 150 comprises (i) a non-inverting (+) input terminal which is coupled to a sixth node N6 between the resistors R4 and R5 and configured to receive an input voltage $V_{TRIP}$, (ii) an inverting (−) input terminal which is coupled to a threshold voltage node comprising a prespecified threshold voltage $V_{REF}$, and (iii) an output terminal coupled to the set S input terminal of the latch circuit 130. The second comparator 150 comprises a non-inverting comparator topology, wherein the output of the second comparator 150 transitions to logic "1" when the input voltage $V_{TRIP}$ is greater than the threshold voltage $V_{REF}$, and transitions to logic "0" when the input voltage $V_{TRIP}$ is less than the threshold voltage $V_{REF}$. In the exemplary embodiment of FIG. 1, the resistors R4 and R5 form a resistive voltage divider network in which the input voltage $V_{TRIP}$ (which is generated at the node N6) is a fraction of a DC voltage $V_{DC}$ across the storage capacitor C1 at the output node N2 of the power converter circuit 100.

In the exemplary configuration, the output of the first comparator 140 controls the reset R input of the latch circuit 130, and the output of the second comparator 150 controls the set S input of the latch circuit 130. The Q output of the latch circuit 130 controls the operation of the second solid-state switch 120. The following truth table illustrates the operation of the latch circuit 130:

| S | R | Q (current) | Q (next) | STATE |
|---|---|---|---|---|
| 0 | 0 | 0 | 0 | NC |
| 0 | 0 | 1 | 1 | NC |
| 0 | 1 | 0 | 0 | RESET |
| 0 | 1 | 1 | 0 | RESET |
| 1 | 0 | 0 | 1 | SET |
| 1 | 0 | 1 | 1 | SET |

When the Q output of the latch circuit 130 is at a logic "0" level (Reset state), the second solid-state switch 120 is in a turned-off state, which allows the first solid-state switch 110 to be in a turned-on state. On the other hand, when the Q output of the latch circuit 130 is at a logic "1" level (Set state), the second solid-state switch 120 is in a turned-on state, which causes the first solid-state switch 110 to be in a turned-off state.

As noted above, in an exemplary embodiment, the control system 160 of the power converter circuit 100 is configured to control the operation of the first solid-state switch 110 (e.g., HV NMOS FET) and thereby control a flow of current ($I_{Charge}$) to charge the storage capacitor C1 and generate a DC voltage $V_{DC}$ on the output node N2 of the power converter circuit 100. More specifically, in an exemplary embodiment, the power converter circuit 100 operates in a "power mode" and a "control mode." In the power mode (alternatively, energy storage refresh mode), the control system 160 activates the first solid-state switch 110 (on state or turned-on state) to allow charging current $I_{Charge}$ to flow and charge the storage capacitor C1 to a predetermined maximum value of $V_{DC}$ (denoted $V_{DC\_MAX}$). The first solid-state switch 110 is maintained in the turned-on state to allow the charging current to flow and charge the storage capacitor C1 while the voltage across the storage capacitor C1 is below the maximum value $V_{DC\_MAX}$. Once the voltage across the storage capacitor C1 reaches $V_{DC\_MAX}$, the control system 160 deactivates the first solid-state switch 110 (off state or turned-off state). Furthermore, as explained in further detail below, in the control mode, the control system 160 is configured to pre-charge a turn-on threshold voltage at the gate terminal (at the third node N3) of the first solid-state switch 110 during a negative half-cycle of the AC power source 10.

The power converter circuit 100 is configured to charge the storage capacitor C1 during positive half-cycles of an AC waveform of the AC power source 10, which is applied to the input terminal 101. The first diode D1 operates as a half-wave rectifier which rectifies the input AC waveform to generate a half-wave rectified (positive) voltage on the first node N1, such that charging current $I_{Charge}$ will only flow from the first node N1 to the second node N2 when the first solid-state switch 110 is turned on by the control system 160 during a power mode cycle. In other words, the power mode of operation of the power converter circuit 100 is configured to charge the storage capacitor C1 only during positive half-cycles of the input AC waveform of the AC power source 10.

Furthermore, the power converter circuit 100 is configured to charge the second capacitor C2 during each positive half-cycle of the input AC waveform of the AC power source 10, which is applied to the input terminal 101. In particular, during a given positive half-cycle, the second diode D2 is forward biased by the rectified voltage at node N1, and allows the voltage at node N1 to be applied at node N5 to charge the second capacitor C2 to a peak voltage (e.g., 170 V) of the input AC waveform which, in turn, causes the Zener diode Z1 to be reversed biased and clamped at its Zener voltage $V_Z$ (e.g., 10 V). As schematically shown in FIG. 1, the cathode terminal of the Zener diode Z1 is coupled to the gate terminal G (at node N3) of the first solid-state switch 110, and the anode terminal of the Zener diode Z1 is coupled to the source terminal S (at node N2) of the first solid-state switch 110. In this exemplary configuration, the Zener diode Z1 serves to clamp the gate-to-source voltage $V_{GS}$ (alternatively, turn-on voltage, threshold voltage) of the first solid-state switch 110 to the Zener voltage $V_Z$, i.e., the voltage across the nodes N3 and N2 is clamped to $V_Z$ during each positive half-cycle of the input AC waveform. Essentially, it is to be noted that the second diode D2, the second capacitor C2, the resistors R1 and R2, and the Zener diode Z1 implement switch driver circuitry (e.g., a self-biasing driver circuit) that is configured to generate a regulated threshold voltage across the nodes N3 and N2 to drive the first solid-state switch 110, wherein the regulated threshold voltage comprises the Zener voltage $V_Z$ of the Zener diode Z1.

At the beginning of a positive half-cycle of the input AC waveform of the AC power source 10 (i.e., when transitioning from a negative half-cycle to a positive half-cycle), the output of the first comparator 140 transitions from a logic "1" level to a logic "0" level since $V_{IN}$>GND, whereby the logic "0" level is applied to the reset R input of the latch circuit 130. In addition, assume that at the beginning of the positive half-cycle, the voltage $V_{DC}$ across the storage capacitor C1 is at a level which is less than $V_{DC\_MAX}$ such that the voltage $V_{TRIP}$ at node N6 is less than the threshold voltage $V_{REF}$ (i.e., $V_{TRIP}<V_{REF}$). In this instance, the output of the second comparator 150 will be at a logic a logic "0" level such that the set S input of the latch circuit 130 is at a logic "0" level. In this state, at the beginning of the positive half-cycle, the output Q of the latch circuit 130 is in "reset" state with the Q output set to a logic "0" level, which causes the second solid-state switch 120 to be in a turned-off state due to a logic 0 voltage level applied to the gate terminal G of the second solid-state switch 120.

In this regard, when transitioning to a positive half-cycle of the input AC power waveform, if the voltage $V_{DC}$ across the storage capacitor C1 is at a level which is less than $V_{DC\_MAX}$, and where $V_{TRIP}<V_{REF}$, the control system 160 will operate in a power mode in which the second solid-state switch 120 is turned off, and the first solid-state switch 110 is turned on, thereby allowing charging current $I_{Charge}$ to flow from the first node N1 to the second node N2 and charge the storage capacitor C1 to $V_{DC\_MAX}$. During the power mode, while the voltage across the storage capacitor C1 is below $V_{DC\_MAX}$, a proper $V_{GS}$ is maintained for the first solid-state switch 110 by the fixed Zener voltage $V_Z$ of the reversed biased Zener diode Z1, and the first solid-state switch 110 is maintained in a saturation mode, with $V_{DS}>V_{GS}-V_T$, where $V_{DS}$ and $V_T$ denote the drain-to-source voltage and threshold voltage, respectively, of the first solid-state switch 110.

At some point during the positive-half cycle of the input AC waveform, when the voltage across the storage capacitor C1 reaches $V_{DC\_MAX}$, the voltage $V_{TRIP}$ on the node N6 reaches and exceeds the threshold voltage $V_{REF}$ ($V_{TRIP}>V_{REF}$). As a result, the output of the second comparator 150 transitions to a logic "1" level, such that a logic "1" level is applied to the set S input of the latch circuit 130. In this case, with the reset R input of the latch circuit 130 at the logic "0" level, the output Q of the latch circuit 130 transitions to a logic "1" level (i.e., the latch circuit 130 is placed in the Set state), in response to the logic "1" level output of the second comparator 150 being applied to the set S input of the latch circuit 130. The output Q at the logic "1" level causes the second solid-state switch 120 to be turned on and essentially couple the fourth node N4 to the potential of the ground reference node GND.

In this regard, the activation of the second solid-state switch 120 essentially couples the cathode of the Zener diode Z1 to ground GND potential, which causes the Zener diode Z1 to become forward-biased due to the voltage $V_{DC}$ at node N2. The forward-biasing of the Zener diode Z1, in turn, causes the $V_{GS}$ of the first solid-state switch 110 to fall below the threshold voltage $V_T$ of the first solid-state switch 110 and deactivate (turn off) the first solid-state switch 110 (e.g., with the Zener diode Z1 forward biased, $V_{GS}$ is about −0.7 V). The deactivation of the first solid-state switch 110 stops the flow of charging current $I_{Charge}$ from the first node N1 to the second node N2 (e.g., $I_{Charge}$=0), thereby limiting the DC voltage $V_{DC}$ that is generated across the storage capacitor C1 to the predetermined maximum voltage $V_{DC\_MAX}$.

It is to be noted that when the second solid-state switch 120 is activated at some point during the positive half-cycle of the input AC waveform, causing the fourth node N4 to be coupled to ground GND potential through the second solid-state switch 120, the second capacitor C2 may slightly discharge from the peak voltage (e.g., 170 V) as the input voltage of the input AC waveform decreases. To minimize the amount of discharge, however, the first resistor R1 is selected to have a resistance that is relatively high (e.g., order of megaohms) so that the second capacitor C2 retains a significant amount of its maximum charge level that is attained during the beginning portion of the positive half-cycle of the input AC waveform.

Next, upon transitioning from a positive half-cycle to a negative half-cycle of the input AC waveform, the control system 160 performs a control mode cycle at the start of the negative-half cycle of the AC power waveform. The control mode is configured to precharge the gate voltage (e.g., turn-on threshold voltage) of the first solid-state switch 110 in preparation of the next power mode cycle of operation, which is commenced in the next positive half-cycle, where the first solid-state switch 110 is reactivated, if needed, to recharge the storage capacitor C1 to $V_{DC\_MAX}$ during the next positive half-cycle.

In particular, at the beginning of the negative half-cycle, the output of the first comparator 140 transitions from a logic "0" level to a logic "1" level due to the voltage on node N1 reaching zero such that $V_{IN}$<GND. As such, at the transition to a negative half-cycle, a logic "1" level is applied to the reset R input of the latch circuit 130. Moreover, in instances where the voltage $V_{DC}$ across the storage capacitor C1 decreases to a level that is less than $V_{DC\_MAX}$ (as a result of the storage capacitor C1 being slightly discharged at the end of the positive half-cycle due to power drawn by the DC load 20), the voltage $V_{TRIP}$ on the sixth node N6 will be below threshold voltage $V_{REF}$ ($V_{TRIP}<V_{REF}$) at the beginning of the negative half-cycle. In such instances, the output of the second comparator 150 will be set to a logic "0" level, which is applied to the set S input of the latch circuit 130. Therefore, at the beginning of the negative half-cycle, with a logic "1" level applied to the reset R input and a logic "0" level applied to the set S input, the latch circuit 130 will transition to a Reset state, where the output Q of the latch circuit 130 will transition to a logic "0" level. The resetting of the latch circuit 130 (Q=logic "0") causes the second solid-state switch 120 to be deactivated (turned off).

When the second solid-state switch 120 is deactivated at the beginning of the negative half-cycle of the input AC waveform, the Zener diode Z1 becomes reversed biased (and clamped to the Zener voltage $V_z$) as a result of voltage of the second capacitor C2 (on node N5) being greater than the voltage $V_{DC}$ on node N2. In this regard, at the beginning of the negative half-cycle of the input AC waveform, the gate-to-source voltage $V_{GS}$ (turn-on voltage, threshold voltage) of the first solid-state switch 110 is precharged and clamped to the Zener voltage (e.g., 10 V) of the Zener diode Z1. However, during the negative half-cycle of the input AC waveform the drain-to-source voltage $V_{DS}$ of the first solid-state switch 110 remains at 0V keeping the first solid-state switch 110 turned off (i.e., no flow of charging current $I_{Charge}$), until the next positive half-cycle of the input AC waveform when the voltage at node N1 rises above the voltage on node N2 (i.e., the voltage $V_{DC}$ across the storage capacitor C1), which then causes charging current $I_{Charge}$ to flow and charge the storage capacitor C1, if needed.

It is to be noted that the maximum voltage $V_{DC\_MAX}$ across the storage capacitor C1 will vary depending on the DC voltage requirements of the DC load 20. The maximum voltage $V_{DC\_MAX}$ can be adjusted based on the requirements of the DC load 20 connected to the output terminal 102 of the power converter circuit 100. For example, the maximum voltage $V_{DC\_MAX}$ can be configured by setting the resistance values R4 and R5 to achieve a target $V_{TRIP}$ for a given $V_{REF}$, or by adjusting $V_{REF}$ based on a given $V_{TRIP}$.

Figures 2A, 2B, 2C, 2D:
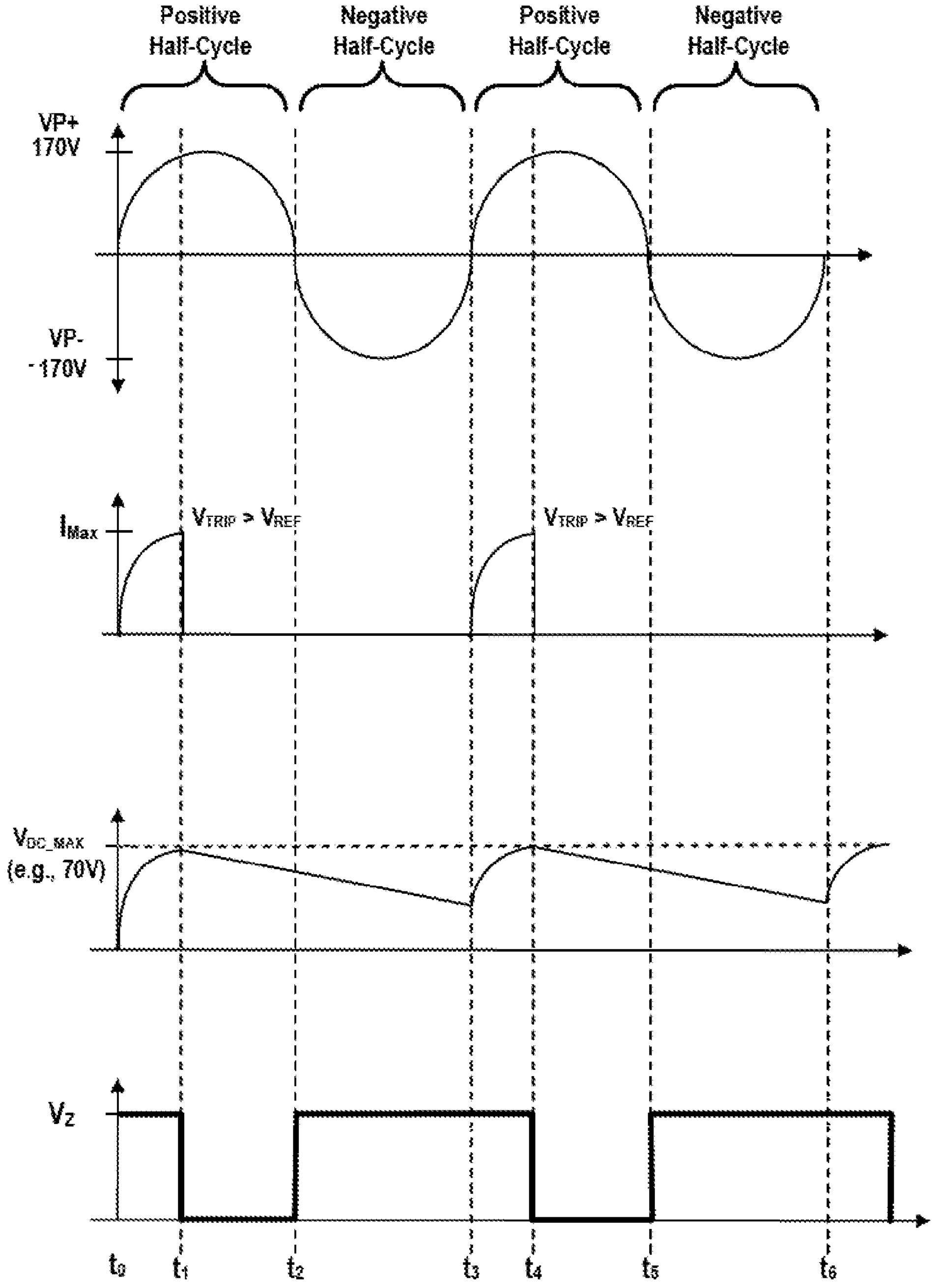
FIGS. 2A, 2B, 2C, and 2D are waveform diagrams which illustrate exemplary modes of operation of the power converter circuit of FIG. 1, according to an exemplary embodiment of the disclosure.

FIGS. 2A, 2B, 2C, and 2D are waveform diagrams which illustrate exemplary modes of operation of the power converter circuit of FIG. 1, according to an exemplary embodiment of the disclosure. In particular, FIG. 2A schematically illustrates an exemplary AC power waveform 200 that is supplied by the AC power source 10, wherein the AC power waveform 200 comprises a sine wave with positive half-cycles and negative half-cycles. The AC power waveform 200 has a positive peak voltage ($VP^+$) in the positive half-cycles, and a negative peak voltage ($VP^-$) in the negative half-cycles. For example, for utility power of 120 V RMS, the positive peak voltage $VP^+$ is about 170V and the negative peak voltage $VP^-$ is about −170V. The exemplary AC power waveform 200 can be a 60 Hz voltage waveform with a period of about 16.66 milliseconds, wherein each half-cycle has a duration of about 8.33 milliseconds.

FIG. 2B depicts a current waveform 210 that represents a charging current $I_{Charge}$ which is generated (up to a maximum charging current $I_{Max}$) during power mode cycles that are performed to charge the storage capacitor C1 during positive half-cycles of the input AC power waveform 200. As shown in FIG. 2B, the charging current $I_{Charge}$ flows until the first solid-state switch 110 is deactivated (e.g., at times $t_1$ and $t_4$) in response to the voltage across the storage capacitor C1 reaching a maximum DC voltage level ($V_{DC-}$ $_{MAX}$). In particular, at times $t_1$ and $t_4$, the control system 160 determines that $V_{TRIP}$ exceeds $V_{REF}$ ($V_{TRIP}>V_{REF}$) and, in response, the control system 160 deactivates the first solid-state switch 110 to terminate the flow of charging current $I_{Charge}$ to the storage capacitor C1 (i.e., $I_{Charge}$ decreases to zero). It is to be noted that in the exemplary circuit configuration shown in FIG. 1, charging current $I_{Charge}$ starts to flow when $V_{DS}$ of the first solid-state switch 110 increases past 0 V (e.g., when the voltage at node N1 reaches and begins to exceed the voltage $V_{DC}$ on node N2, where the charging current $I_{Charge}$ becomes relatively constant when the first solid-state switch 110 transitions from the ohmic mode into the saturation mode, as is understood by those of ordinary skill in the art.

FIG. 2C illustrates an exemplary DC voltage waveform 220 ($V_{DC}$ waveform) which represents the DC voltage at node N2 (across the storage capacitor C1) of the power converter circuit 100 during the positive and negative half-cycles of the input AC power waveform 200. In particular, FIG. 2C illustrates exemplary energy storage cycles of the power converter circuit 100 over two full cycles of the AC power waveform 200. In the exemplary embodiment of FIG. 2C, the maximum DC voltage level, $V_{DC\ MAX}$ is shown to be 70V (which is an exemplary non-limiting value). At the beginning of each positive half-cycle of the input AC power waveform 200 (e.g., times $t_0$, $t_3$, and $t_6$) the DC voltage waveform 220 starts to increase to $V_{DC\_MAX}$. When $V_{DC\_MAX}$ is reached, the first solid-state switch 110 is deactivated (e.g., at times $t_1$, and $t_4$) and the DC voltage waveform 220 decreases (via discharging of the storage capacitor C1) during a remainder of the positive half-cycle and the entirety of the subsequent negative half-cycle (with the assumption that the power converter circuit 100 is supplying DC power to a load connected thereto).

Next, FIG. 2D illustrates an exemplary gate-to-source voltage ($V_{GS}$) waveform 230 of the first solid-state switch 110 that is generated during positive and negative half-cycles of the input AC power waveform 200. As shown in FIG. 2D, the $V_{GS}$ waveform 230 is clamped to a Zener voltage $V_Z$ of the Zener diode Z1 (thereby providing a regulated threshold voltage for the first solid-state switch 110) but reduces to essentially 0V (e.g., −0.7 V) at times (e.g., $t_1$ and $t_4$) during the positive half-cycles of the input AC power waveform 200 when the second solid-state switch 120 is activated, which pulls the gate terminal G of the first solid-state switch 110 to ground GND potential, which result in forward biasing the Zener diode Z1, as discussed above.

As further shown in FIG. 2D, at each transition from a positive half-cycle to a negative half-cycle (e.g., at times $t_2$ and $t_5$), the voltage $V_{GS}$ increases to the Zener voltage $V_Z$ of the Zener diode Z1 as a result of the deactivation of the second solid-state switch 120. In particular, as noted above, when the second solid-state switch 120 is deactivated at the beginning of the negative half-cycle of the input AC power waveform 200, the Zener diode Z1 becomes reversed biased (and clamped to the Zener voltage $V_Z$) as a result of voltage of the second capacitor C2 being greater than the voltage $V_{DC}$ on node N2. Consequently, at the beginning of each negative half-cycle of the input AC power waveform 200, the gate-to-source voltage $V_{GS}$ (threshold voltage) of the first solid-state switch 110 is precharged and clamped to the Zener voltage (e.g., 10 V) of the Zener diode Z1.

As shown in FIG. 2D, although the regulated threshold voltage $V_{GS}$ of the first solid-state switch 110 is precharged to $V_Z$ during the periods, e.g., from $t_2$ to $t_3$, and from $t_5$ to $t_6$, the first solid-state switch 110 remains turned off during the periods from $t_2$ to $t_3$ and from $t_5$ to $t_6$ of the negative half-cycles of the AC power waveform 200 such that no charging current flows to charge the storage capacitor C1 (i.e., the storage capacitor C1 is not charged during the negative half-cycles of the AC power waveform 200). However, at the transitions from the negative half-cycle to the positive half-cycle (e.g., at times $t_3$ and $t_6$), the precharged regulated threshold voltage $V_{GS}$ allows the first solid-state switch 110 to be turned on and source charging current to recharge the storage capacitor C1 up to $V_{DC\ MAX}$.

Figure 3:
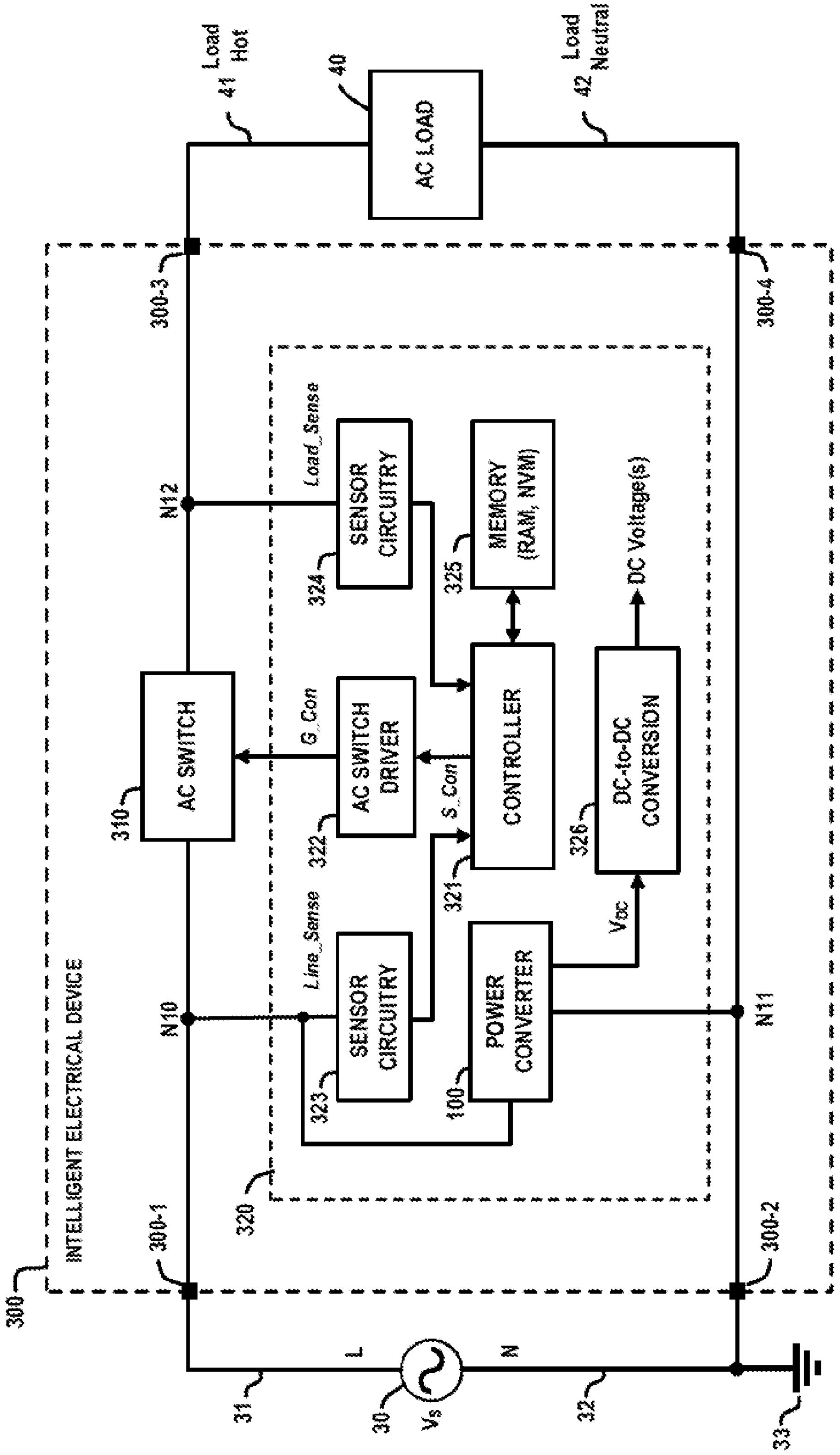
FIG. 3 schematically illustrates an intelligent electrical device which implements a power converter circuit, according to an exemplary embodiment of the disclosure.

It is to be appreciated that the power converter circuit 100 of FIG. 1 can be implemented in various applications. For example, the power converter circuit 100 of FIG. 1 can be utilized to convert AC power to DC power, wherein the DC power is utilized to provide or otherwise generate regulated DC supply voltage(s) to control DC-powered components, such control circuitry. In some embodiments, the power converter circuit 100 is used to generate DC supply voltages for control circuitry of an intelligent electrical device, such as an intelligent solid-state circuit breaker, an intelligent solid-state light switch device (e.g., intelligent dimmer switch), an intelligent circuit interrupter device, etc. For example, FIG. 3 schematically illustrates an intelligent electrical device 300 which implements the power converter circuit 100 of FIG. 1, according to an exemplary embodiment of the disclosure.

The intelligent electrical device 300 comprises a first power input terminal 300-1, a second power input terminal 300-2, a first load terminal 300-3, a second load terminal 300-4, a solid-state AC switch 310, and an intelligent switch control system 320. The intelligent switch control system 320 comprises various components and circuitry such as the power converter circuit 100 (FIG. 1), a controller 321, AC switch driver circuitry 322, sensor circuitry 323 and 324, one or more memory devices 325, and DC-to-DC conversion circuitry 326, the functions of which will be explained in detail below. In some embodiments, the solid-state AC switch 310 comprises a bidirectional solid-state switch comprising, e.g., two solid-state switches that are serially connected back-to-back, an exemplary embodiment of which will be described below in conjunction with FIG. 4. The intelligent switch control system 320 may comprise a system-on-a-chip (SoC) device or a system-in-package (SIP) device which integrates the various components 321, 322, 323, 324, 326, 326, and 100 (or portions thereof) in a package structure.

The intelligent electrical device 300 is configured to control AC power that is supplied from an AC power source 30 (e.g., AC mains) to an AC load 40. The first and second power input terminals 300-1 and 300-2 are configured to connect the intelligent electrical device 300 to a line phase (L) 31 and a neutral phase (N) 32 of the AC power source 30. The first and second load terminals 300-3 and 300-4 are configured to connect the intelligent electrical device 300 to a load hot line 41 and a load neutral line 42, respectively, which are connected to the AC load 40. The neutral phase (N) 32 of the AC power source 30 is bonded to earth ground 33 (GND). The earth ground 33 is typically connected to a ground bar in a circuit breaker distribution panel, wherein the ground bar is bonded to a neutral bar in the circuit breaker distribution panel. An earth ground connection is made from the ground bar in the circuit breaker distribution panel to an earth ground terminal (not shown) of the intelligent electrical device 300. The earth ground 33 provides an alternative low-resistance path for ground-fault return current to flow in the event of an occurrence of a ground-fault condition within the intelligent electrical device 300 or the AC load 40.

The intelligent electrical device 300 can be any type of intelligent electrical device which is configured to switchably connect/disconnect AC power to/from a given load. For example, the intelligent electrical device 300 can be an intelligent solid-state circuit breaker, an intelligent solid-state light switch device (e.g., intelligent dimmer switch), an intelligent circuit interrupter device, an intelligent electrical output (e.g., ground fault circuit interrupter (GFCI) outlet), etc. The intelligent switch control system 320 implements control circuitry, control logic and algorithms that are configured to intelligently control various functions and operations of the intelligent electrical device 300 in accordance with the device type.

The power converter circuit 100 is configured to generate an output voltage $V_{DC}$ (as described above) in conjunction with FIGS. 1 and 2A-2D. The power converter circuit 100 is coupled to nodes N10 and N11 to thereby apply the AC power input to the power converter circuit 100. In an exemplary embodiment, the power converter circuit 100 generates an output voltage $V_{DC}$ which is ground referenced to the neutral N of the AC power source 30. The output voltage $V_{DC}$ is applied to an input of the DC-to-DC conversion circuitry 326. The DC-to-DC conversion circuitry 326 is configured to convert the voltage $V_{DC}$ into one or more regulated DC voltages that are used as DC supply voltages to operate the components and circuitry of the intelligent switch control system 320. For example, in some embodiments, the DC-to-DC conversion circuitry 326 is configured to generate DC voltages that are used for operation of the power converter circuit 100 (e.g., the threshold voltage $V_{REF}$ which is applied to the second comparator 150 (FIG. 1) and the supply rail voltages for the first and second comparators 140 and 150, and the latch circuit 130, etc.).

In some embodiments, the DC-to-DC conversion circuitry 326 comprises one or more DC-DC step-down voltage switching regulator circuits (e.g., Buck switching regulators) which are configured to convert the voltage $V_{DC}$ into or more regulated DC rail voltages with different voltage levels. In some embodiments, the DC-to-DC conversion circuitry 326 is configured to convert the voltage $V_{DC}$ into, e.g., one or more industry standard DC voltages including, but not limited to 12V, 10V, 5V, 3.3V, 2.5V, 2.7V, 1.8V, etc., as needed, depending on the DC supply voltage requirements of the control circuitry of the intelligent switch control system 320, and the AC switch driver circuitry 322.

In some embodiments, the controller 321 is implemented using at least one intelligent, programmable hardware processing device such as a microprocessor, a microcontroller, an ASIC, an FPGA, a CPU, etc., which is configured to execute software routines to generate switch control signals (denoted S_Con), which are applied to the AC switch driver circuitry 322 to intelligently control the operation of the solid-state AC switch 310 to perform various functions, depending on the device type of the intelligent electrical device 300. In some embodiments, the one or more memory devices 325 comprise volatile random-access memory (RAM) and non-volatile memory (NVM), such as Flash memory, to store calibration data, operational data, and executable code for performing various intelligent operations of the intelligent electrical device 300, depending on the device type (e.g., intelligent circuit breaker, intelligent dimmer switch, etc.) For example, in some embodiments where the intelligent electrical device 300 comprises an intelligent electrical light switch with dimming capability, the controller 321 may execute a PWM (pulse width modulation) process to generate a pulse width modulated switch control signal S_Con to modulate the turn-on time of the solid-state AC switch 310 during positive and negative half cycles of the input AC power to thereby modulate the amount of AC power supplied to the AC load 40.

In the exemplary embodiment of FIG. 3, the AC switch driver circuitry 322 is configured to generate gate control signals (denoted G_Con) in response to switch control signals S_Con from the controller 321, wherein the gate control signals G_Con are applied to a control terminal of the solid-state AC switch 310 to turn on/off the solid-state AC switch 310. Although not specifically shown in FIG. 3, in a neutral ground-referenced design, some form of isolation circuitry and/or components would be implemented to provide AC-DC isolation and properly drive the solid-state AC switch 310 with gate control signals G_Con generated by the AC switch driver circuitry 322.

In some embodiments, the sensor circuitry 323 comprises voltage detection and/or current detection circuitry to sense a line voltage and/or a line current at node N10 at the line side of the solid-state AC switch 310. Further, in some embodiments, the sensor circuitry 324 comprises voltage detection circuitry and/or current detection circuitry to sense load voltage and/or load current at node N12 at the load side of the solid-state AC switch 310. The configuration and types of sensors used for the sensor circuitry 323 and 324 will vary depending on the application. For example, for light dimming applications, the line-side sensor circuitry 323 may comprise a voltage phase detector to determine zero-crossings of the AC supply voltage waveform at node N10 and the direction of polarity transition of the AC supply voltage waveform at node N10 (e.g., transition from a positive to a negative half-cycle, or transition from a negative to a positive half-cycle of AC supply voltage waveform Vs). The zero-crossing detections are processed by the controller 321 to determine and control the timing at which the solid-state AC switch 310 is activated and deactivated following a detected zero-voltage crossing of the AC supply voltage waveform at the line sense node N10.

In some embodiments, for intelligent circuit breaker applications, the load-side sensor circuitry 324 comprises current detection circuitry to sense a magnitude of load current at node N12. In this regard, the sensor circuitry 324 can be utilized by the controller 321 to detect fault conditions, e.g., overcurrent, short circuit, etc., and allow the controller 321 to generate switch control signal S_Con to deactivate the solid-state AC switch 310 in the event that a fault condition is detected. In some embodiments, the intelligent electrical device 300 comprises an intelligent solid-state circuit breaker which is implemented using exemplary circuit breaker architectures and techniques as disclosed in U.S. Pat. No. 11,373,831, which is commonly assigned and fully incorporated herein by reference.

As schematically illustrated in FIG. 3, the solid-state AC switch 310 is connected between the line side node N10 and load side node N12 in an electrical path between the first power input terminal 300-1 and the first load terminal 300-3. As noted above, in some embodiments, the solid-state AC switch 310 comprises a bidirectional solid-state switch device which comprises two serially connected solid-state switches with a common node connection. For example, FIG. 4 schematically illustrates an embodiment of a solid-state AC switch, which can be implemented in the intelligent electrical device of FIG. 3, according to an exemplary embodiment of the disclosure.

Figure 4:
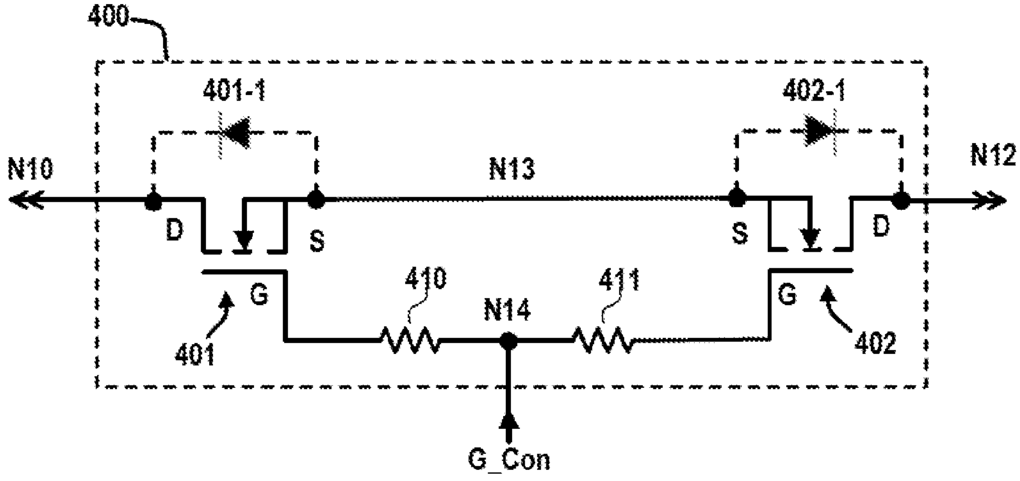
FIG. 4 schematically illustrates an embodiment of a solid-state AC switch, which can be implemented in the intelligent electrical device of FIG. 3, according to an exemplary embodiment of the disclosure.

More specifically, FIG. 4 schematically illustrates a bidirectional solid-state switch 400 which comprises a first solid-state switch 401 and a second solid-state switch 402, which are serially connected between the first node N10 and the second node N12, and which are coupled back-to-back at node N13. In some embodiments, the bidirectional solid-state switch 400 comprises a bidirectional MOSFET switch in which the first and second solid-state switches 401 and 402 comprise power MOSFET devices, e.g., N-type enhancement MOSFET devices, having respective gate terminals G, drain terminals D, and source terminals S. The drain terminal D of the first solid-state switch 401 is coupled to the line side node N10, and the drain terminal D of the second solid-state switch 402 is coupled to the load side node N12. The source terminals S of the first and second solid-state switches 401 and 402 are commonly coupled at the common node N13, thereby implementing a common source bidirectional MOSFET switch configuration. The gate terminals G of the first and second solid-state switches 401 and 402 are commonly connected to node N14 through the respective resistors 410 and 411.

As further shown in FIG. 4, the first and second solid-state switches 401 and 402 comprise intrinsic body diodes 401-1 and 402-1, respectively, wherein each intrinsic body diode 401-1 and 402-1 represents a P-N junction between a P-type substrate body and an N-doped drain region of the respective N-type MOSFET device. It is to be noted that intrinsic body-to-source diodes of the first and second solid-state switches 401 and 402 are not shown as such intrinsic body-to-source diodes are assumed to be shorted out by a common connection between the source terminal S and a body terminal (e.g., the N+ source region and P-doped body junction are shorted through source metallization).

While FIG. 4 illustrates an exemplary embodiment in which the bidirectional solid-state switch 400 comprises two MOSFET devices, e.g., the first and second solid-state switches 401 and 402, in some embodiments, each of the first and second solid-state switches 401 and 402 can be implemented with two or more MOSFET devices connected in parallel. With configuration enables enhanced heat dissipation and enhanced power handling. Furthermore, in some embodiments, the bidirectional solid-state switch 400 can be implemented using other types of solid-state switch devices. For example, in some embodiments, the first and second solid-state switches 401 and 402 are implemented using integrated gate bipolar transistor (IGBT) devices having emitter terminals that are commonly connected at the common node N13. In other embodiments, the first and second solid-state switches 401 and 402 can be implemented using other types of FET devices including, but not limited to, GaN (Gallium Nitride) FET devices, cascode GaN FET devices, silicon carbide (SiC) junction FET devices, cascode SiC junction FET devices, etc.

In all embodiments, the bidirectional solid-state switch 400 is configured to (i) allow the bidirectional flow of AC current in the electrical path between the nodes N10 and N12 when the bidirectional solid-state switch 400 is in a turned-on state and (ii) interrupt the bidirectional flow of AC current in the electrical path between nodes N10 and N12 when the bidirectional solid-state switch 400 is in a turned-off state. As noted above, the bidirectional solid-state switch 400 can be turned on and off by applying appropriate gate control signals G_Con to the gate terminals G of the first and second solid-state switches 401 and 402, which are commonly coupled to node N14.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A power converter circuit, comprising:

a first solid-state switch connected between a first node and a second node;

a first capacitor coupled between the second node and a ground reference node; and a control system configured to control operation of the first solid-state switch, wherein the control system is configured to:

monitor a voltage level across the first capacitor and (i) turn on the first solid-state switch during a positive half-cycle of an alternating current (AC) power waveform coupled to the first node to cause charging current to flow from the first node to the second node and charge the first capacitor, in response to determining that the voltage level across the first capacitor is less than a maximum direct current (DC) voltage level, and (ii) turn off the first solid-state switch during the positive half-cycle of the AC power waveform, in response to determining that the voltage level across the first capacitor has reached the maximum DC voltage level; and generate a regulated threshold voltage for the first solid-state switch during a negative half-cycle of the AC power waveform while maintaining the first solid-state switch turned off during the negative half-cycle.

2. The power converter circuit of claim 1, wherein the first solid-state switch comprises a high voltage metal-oxide-semiconductor field-effect transistor (MOSFET) device.

3. The power converter circuit of claim 1, further comprising a first diode having a cathode terminal coupled to the first node and an anode terminal coupled to an input terminal of the power converter circuit, wherein the first diode is configured to rectify the AC power waveform applied to the input terminal and generate a half-wave rectified voltage at the first node.

4. The power converter circuit of claim 1, wherein:

the control system comprises switch driver circuitry which is configured to generate the regulated threshold voltage for the first solid-state switch;

the switch driver circuitry comprises a Zener diode which comprises an anode terminal coupled to the second node and a cathode terminal coupled to a third node; and the switch driver circuitry is configured to reverse bias the Zener diode during the positive half-cycle of the AC power waveform to cause a Zener voltage to be generated across the third and second nodes; and the Zener voltage comprises the regulated threshold voltage for the first solid-state switch.

5. The power converter circuit of claim 4, wherein the switch driver circuitry further comprises:

a first resistor coupled to and between the third node and a fourth node;

a second resistor coupled to and between the fourth node and a fifth node;

a second capacitor coupled to and between the fifth node and the ground reference node; and a second diode comprising an anode terminal coupled to the first node and a cathode terminal coupled to the fifth node.

6. The power converter circuit of claim 5, wherein:

the second diode is configured to be forward biased during the positive half-cycle and couple the first node to the fifth node to charge the second capacitor to a peak voltage level of the AC power waveform on the first node; and the Zener diode is reverse biased as a result of a potential difference between the fifth node and the second node.

7. The power converter circuit of claim 4, wherein the control system comprises:

a second solid-state switch which comprises a first terminal coupled to the third node, a second terminal coupled to the ground reference node, and a control terminal; and control circuitry which is configured to apply a control signal to the control terminal of the second solid-state switch to activate the second solid-state switch in response to determining that the voltage level across the first capacitor has reached the maximum DC voltage level;

wherein the activation of the second solid-state switch couples the cathode terminal of the Zener diode to the ground reference node and thereby causes the Zener diode to be forward biased; and wherein the forward biased Zener diode causes the first solid-state switch to be deactivated and terminate the flow of charging current from the first node to the second node during the positive half-cycle of the AC power waveform.

8. The power converter circuit of claim 7, wherein the control circuitry is configured to maintain the second solid-state switch in a turned-off state during an entirety of each negative half-cycle of the AC power waveform.

9. The power converter circuit of claim 1, wherein the control system is configured to maintain the first solid-state switch in a turned-off state during an entirety of each negative half cycle of the AC power waveform.

10. The power converter circuit of claim 1, wherein the control system comprises:

a second solid-state switch which comprises a first terminal that is coupled to a control terminal of the first solid-state switch, a second terminal that is coupled to the ground reference node, and a control terminal;

a resistive voltage divider circuit which is coupled to and between the second node and the ground reference node, and configured generate a trip voltage that is proportional to a voltage level across the first capacitor;

a first comparator configured to compare the trip voltage to a first threshold voltage, and generate a first comparator output signal based a result of comparing the trip voltage to the first threshold voltage;

a second comparator configured to compare an input voltage on the first node with a ground reference node voltage and generate a second comparator output signal based on a result of comparing the input voltage to the ground reference node voltage;

a latch circuit comprising a first input port configured to receive the first comparator output signal, a second input port configured to receive the second comparator output signal, and an output port coupled to the control terminal of the second solid-state switch;

wherein the latch circuit is configured to output a control signal to control an activation and a deactivation of the second solid-state switch based on logic levels of the first and second comparator output signals;

wherein the activation of the second solid-state switch causes the first solid-state switch to turn off; and wherein the deactivation of the second solid-state switch allows the first solid-state switch to be turned on during a positive half-cycle of the AC power waveform.

11. The power converter circuit of claim 10, wherein the latch circuit comprises a Set-Reset flip-flop circuit.

12. An electrical device, comprising:

a solid-state alternating current (AC) switch coupled between a power input terminal and a load output terminal of the electrical device;

a switch control system configured to control operation of the solid-state AC switch; and a power converter circuit configured to convert AC power, which is applied to the power input terminal of the electrical device, into direct current (DC) power for operating the switch control system of the electrical device;

wherein the power converter circuit comprises:

a first solid-state switch connected between a first node and a second node;

a first capacitor coupled between the second node and a ground reference node; and a control system configured to control operation of the first solid-state switch, wherein the control system is configured to:

monitor a voltage level across the first capacitor and (i) turn on the first solid-state switch during a positive half-cycle of an AC power waveform coupled to the first node and cause charging current to flow from the first node to the second node to charge the first capacitor, in response to determining that the voltage level across the first capacitor is less than a maximum DC voltage level, and (ii) turn off the first solid-state switch during the positive half-cycle of the AC power waveform, in response to determining that the voltage level across the first capacitor has reached the maximum DC voltage level; and generate a regulated threshold voltage for the first solid-state switch during a negative half-cycle of the AC power waveform while maintaining the first solid-state switch turned off during the negative half-cycle.

13. The electrical device of claim 12, wherein the power converter circuit comprises a first diode having a cathode terminal coupled to the first node and an anode terminal coupled to the power input terminal of the electrical device, wherein the first diode is configured to rectify the AC power waveform applied to the power input terminal and generate a half-wave rectified voltage at the first node.

14. The electrical device of claim 12, wherein:

the control system of the power converter circuit comprises switch driver circuitry which is configured to generate the regulated threshold voltage for the first solid-state switch;

the switch driver circuitry comprises a Zener diode which comprises an anode terminal coupled to the second node and a cathode terminal coupled to a third node; and the switch driver circuitry is configured to reverse bias the Zener diode during the positive half-cycle of the AC power waveform to cause a Zener voltage to be generated across the third and second nodes; and the Zener voltage comprises the regulated threshold voltage for the first solid-state switch.

15. The electrical device of claim 14, wherein the switch driver circuitry further comprises:

a first resistor coupled to and between the third node and a fourth node;

a second resistor coupled to and between the fourth node and a fifth node;

a second capacitor coupled to and between the fifth node and the ground reference node; and a second diode comprising an anode terminal coupled to the first node and a cathode terminal coupled to the fifth node;

wherein the second diode is configured to be forward biased during the positive half-cycle and couple the first node to the fifth node to charge the second capacitor to a peak voltage level of the AC power waveform on the first node; and wherein the Zener diode is reverse biased as a result of a potential difference between the fifth node and the second node.

16. The electrical device of claim 14, wherein the control system of the power converter circuit comprises:

a second solid-state switch which comprises a first terminal coupled to the third node, a second terminal coupled to the ground reference node, and a control terminal; and control circuitry configured to apply a control signal to the control terminal of the second solid-state switch to activate the second solid-state switch in response to determining that the voltage level across the first capacitor has reached the maximum DC voltage level;

wherein the activation of the second solid-state switch couples the cathode terminal of the Zener diode to the ground reference node and thereby causes the Zener diode to be forward biased; and wherein the forward biased Zener diode causes the first solid-state switch to be deactivated and terminate the flow of charging current from the first node to the second node during the positive half-cycle of the AC power waveform.

17. The electrical device of claim 12, wherein the electrical device is an intelligent solid-state circuit breaker.

18. The electrical device of claim 12, wherein the electrical device is an intelligent solid-state light dimmer switch.

19. A method, comprising:

controlling a first solid-state switch which is coupled to and between a first node and a second node, to charge a first capacitor which is coupled to and between the second node and a ground reference node, using current drawn during a positive half-cycle of an alternating current (AC) power waveform present on the first node, to generate a direct current (DC) voltage on the second node, wherein controlling the first solid-state switch comprises:

monitoring a voltage level across the first capacitor;

turning on the first solid-state switch during the positive half-cycle of the AC power waveform to cause charging current to flow from the first node to the second node and charge the first capacitor, in response to determining that the voltage level across the first capacitor is less than a maximum DC voltage level;

turning off the first solid-state switch during the positive half-cycle of the AC power waveform, in response to determining that the voltage level across the first capacitor has reached the maximum DC voltage level; and generating a regulated threshold voltage for the first solid-state switch during a negative half-cycle of the AC power waveform while maintaining the first solid-state switch turned off during the negative half-cycle.

20. The method of claim 19, wherein:

the regulated threshold voltage comprises a Zener voltage of a Zener diode which comprises a cathode terminal coupled to a gate terminal of the first solid-state switch and an anode terminal coupled to a source terminal of the first solid-state switch;

turning off the first solid-state switch comprises activating a second solid-state switch to cause the Zener diode to be placed in a forward biased state to turn off the first solid-state switch and terminate the flow of charging current from the first node to the second node during the positive half-cycle of the AC power waveform; and turning on the first solid-state switch comprises deactivating the second solid-state switch to cause the Zener diode to be placed in a reverse biased state to drive the first solid-state switch using the Zener voltage of the reverse biased Zener diode.

* * * * *